US012355233B2

(12) United States Patent
Ochoa

(10) Patent No.: US 12,355,233 B2
(45) Date of Patent: Jul. 8, 2025

(54) PROTECTION CIRCUITS

(71) Applicant: GE Verona Infrastructure Technology LLC, Greenville, SC (US)

(72) Inventor: Ismael Adolfo Ochoa, Stafford (GB)

(73) Assignee: GE Vernova Infrastructure Technology LLC, Greenville, SC (US)

( * ) Notice: Subject to any disclaimer, the term of this patent is extended or adjusted under 35 U.S.C. 154(b) by 72 days.

(21) Appl. No.: 18/251,381

(22) PCT Filed: Nov. 12, 2021

(86) PCT No.: PCT/EP2021/081516
§ 371 (c)(1),
(2) Date: May 1, 2023

(87) PCT Pub. No.: WO2022/106311
PCT Pub. Date: May 27, 2022

(65) Prior Publication Data
US 2024/0022066 A1    Jan. 18, 2024

(30) Foreign Application Priority Data
Nov. 18, 2020 (EP) ..................... 20275169

(51) Int. Cl.
*H02H 7/26* (2006.01)
*G01R 31/08* (2020.01)
(52) U.S. Cl.
CPC .......... *H02H 7/261* (2013.01); *G01R 31/086* (2013.01); *H02H 7/268* (2013.01)

(58) Field of Classification Search
CPC ....... H02H 7/261; H02H 7/268; G01R 31/086
See application file for complete search history.

(56) References Cited

U.S. PATENT DOCUMENTS

| 7,117,105 | B2 | 10/2006 | Premerlani et al. |
| 7,539,907 | B1* | 5/2009 | Johnsen ................ G06F 11/008 |
| | | | 714/26 |
| 10,677,834 | B2* | 6/2020 | Kasztenny ............ G01R 31/088 |
| 2003/0216876 | A1* | 11/2003 | Premerlani ............... G06F 1/12 |
| | | | 702/58 |
| 2004/0130838 | A1 | 7/2004 | Papallo et al. |
| 2007/0014062 | A1* | 1/2007 | Fischer ................ H02H 1/0007 |
| | | | 361/62 |

(Continued)

OTHER PUBLICATIONS

International Search Report and Written Opinion for PCT/EP2021/081516, dated Feb. 24, 2022, 13 pages.

(Continued)

*Primary Examiner* — Scott Bauer
(74) *Attorney, Agent, or Firm* — Eversheds Sutherland (US) LLP

(57) ABSTRACT

A protection circuit, for protecting a whole or part of a HVDC power transmission network, includes a number of sets of sensors, each of which set defines a respective protection zone. The protection circuit also includes a controller that is programmed to evaluate sensor information received from the sensors to determine whether a fault has occurred within a protection zone. The controller is further programmed, in the event of a sensor in a protection zone failing, to dynamically reconfigure the affected protection zone by including a sensor from another protection zone.

9 Claims, 4 Drawing Sheets

(56) References Cited

U.S. PATENT DOCUMENTS

2013/0088802 A1* 4/2013 Berggren .............. H02H 3/42
                                                                             361/65
2016/0181802 A1* 6/2016 Jacobson .............. H02M 3/02
                                                                             307/31

OTHER PUBLICATIONS

Extended Europran Search Report for EP20275169.9 dated May 14, 2021, 8 pages.

\* cited by examiner

PROTECTION CIRCUITS

TECHNICAL FIELD

This invention relates to a protection circuit for protecting a whole or part of a High Voltage Direct Current (HVDC) power transmission network, a HVDC power transmission network including such a protection circuit, and a method operating such a protection circuit.

BACKGROUND OF THE INVENTION

In HVDC power transmission networks AC power is typically converted to DC power for transmission via overhead lines, under-sea cables and/or underground cables. This conversion removes the need to compensate for the AC capacitive load effects imposed by the power transmission medium, i.e. the transmission line or cable, and reduces the cost per kilometre of the lines and/or cables, and thus becomes cost-effective when power needs to be transmitted over a long distance. DC power may also be transmitted directly from offshore wind parks to onshore AC power transmission networks The conversion between DC power and AC power is utilized where it is necessary to interconnect DC and AC networks. In any such power transmission network, converters (i.e. power converters) are required at each interface between AC and DC power to affect the required conversion from AC to DC or from DC to AC.

SUMMARY OF THE INVENTION

According to a first aspect of the invention there is provided a protection circuit, for protecting a whole or part of a HVDC power transmission network, comprising:
   a plurality of sets of sensors, each of which set defines a respective protection zone; and
   a controller programmed to evaluate sensor information received from the sensors to determine whether a fault has occurred within a protection zone,
   the controller being further programmed in the event of a sensor in a protection zone failing to dynamically reconfigure the affected protection zone by including a sensor from another protection zone.

Dynamically reconfiguring the affected protection zone, i.e. reconfiguring the affected protection zone while the associated HVDC power transmission network continues to transfer power, is beneficial because it avoids an unnecessary interruption in power transfer and so maintains the availability performance of the network.

Meanwhile, reconfiguring the affected protection zone by including a sensor from another protection zone provides two significant advantages. Firstly it maintains safety by allowing the protection circuit to continue to respond as soon as needed to permit the interruption of a fault current and thereby avoid a potentially lethal voltage in the affected, faulty protection zone. Secondly it ensures that the protection circuit remains reliable, i.e. correctly operates only if there is a fault within one of the protection zones.

Preferably the controller includes a switching module to select the sensor from another protection zone based on the location of the failed sensor.

The inclusion of such a switching module is desirable because it permits the swift, i.e. dynamic, reconfiguration of the affected protection zone in an optimal manner depending on the overall configuration of the associated HVDC power transmission network.

Optionally the switching module receives first and second forms of sensor information from each sensor, the first form of sensor information being current flow information and the second form of sensor information being sensor status information.

Receiving the aforementioned first and second forms of sensor information is advantageous because the first form permits an evaluation of the health of the associated HVDC power transmission network within the various protection zones, while the second form is indicative of the health of each sensor.

The switching module may utilise the sensor status information to identify a failed sensor and thereafter select a sensor from another protection zone to reconfigure the affected protection zone.

Receiving sensor status information is particularly desirable as it allows the switching module, and hence the controller overall, to identify when a sensor has failed and to respond accordingly to reconfigure the affected protection zone.

Optionally, following the identification of a ailed sensor, the switching module inhibits further transmission within the controller of the current flow information from the failed sensor.

Such a feature ensures that only reliable current flow information is utilised within the controller, and so helps to avoid the triggering of a false protection event.

In a preferred embodiment of the invention the controller additionally includes a plurality of evaluation modules, each evaluation module corresponding to a protection zone, and being configured to evaluate the current flow information from at least one sensor to determine whether a fault has occurred within the corresponding protection zone.

The inclusion of a plurality of such evaluation modules provides a robust and reliable way of evaluating whether a fault has occurrent within a given protection zone.

Preferably at least one evaluation module is a unitary evaluation module configured to evaluate whether the current flow information from a single sensor exceeds a predetermined threshold.

In another preferred embodiment of the invention at least one evaluation module is a multiple evaluation module configured to evaluate whether a summation of the current flow information from a plurality of sensors exceeds a predetermined threshold.

The foregoing arrangements desirably permit the evaluation of whether a fault has occurred in a range of differently configured protection zones, and so allows the protection circuit of the invention to protect a range of different physical components, e.g. a power converter or a power transmission conduit, such as an underground cable or overhead line, within an associated HVDC power transmission network.

The transfer of current flow information from the switching module to each evaluation module may be synchronised.

Synchronising the transfer of such current flow information from the switching module to each evaluation module, i.e. coordinating the time at which the current flow information is distributed, beneficially helps to avoid the triggering of a false protection event, e.g. in the very short time between a sensor being identified as faulty and the affected protection zone being reconfigured.

According to a second aspect of the invention there is provided a HVDC power transmission network including a protection circuit as described hereinabove.

The HVDC power transmission network of the invention shares the advantages of the corresponding features of the protection circuit of the invention.

According to a third aspect of the invention there is provided a method of operating a protection circuit for a whole or part of a HVAC power transmission network, the protection circuit including a plurality of sets of sensors, each of which sets defines a respective protection zone, and a controller which receives sensor information from the sensors, and the method comprising the steps of:
(a) evaluating the sensor information to determine whether a fault has occurred within a protection zone; and
(b) in the event of a sensor in a protection zone failing, dynamically reconfiguring the affected protection zone by including a sensor from another protection zone.

The method of the invention similarly shares the advantages of the corresponding features of the protection circuit of the invention.

It will be appreciated that the use of the terms "first" and "second", and the like, e.g. first and second sensors, in this patent specification is merely intended to help distinguish between similar features, and is not intended to indicate the relative importance of one feature over another feature, unless otherwise specified.

Within the scope of this application it is expressly intended that the various aspects, embodiments, examples and alternatives set out in the preceding paragraphs, and the claims and/or the following description and drawings, and in particular the individual features thereof, may be taken independently or in any combination. That is, all embodiments and all features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWING

There now follows a brief description of preferred embodiments of the invention, by way of non-limiting example, with reference being made to the following figures in which.

The figures are not necessarily to scale, and certain features and views of the figures may be shown exaggerated in scale or in schematic form in the interests of clarity and conciseness.

DETAILED DESCRIPTION

Figure 1A:
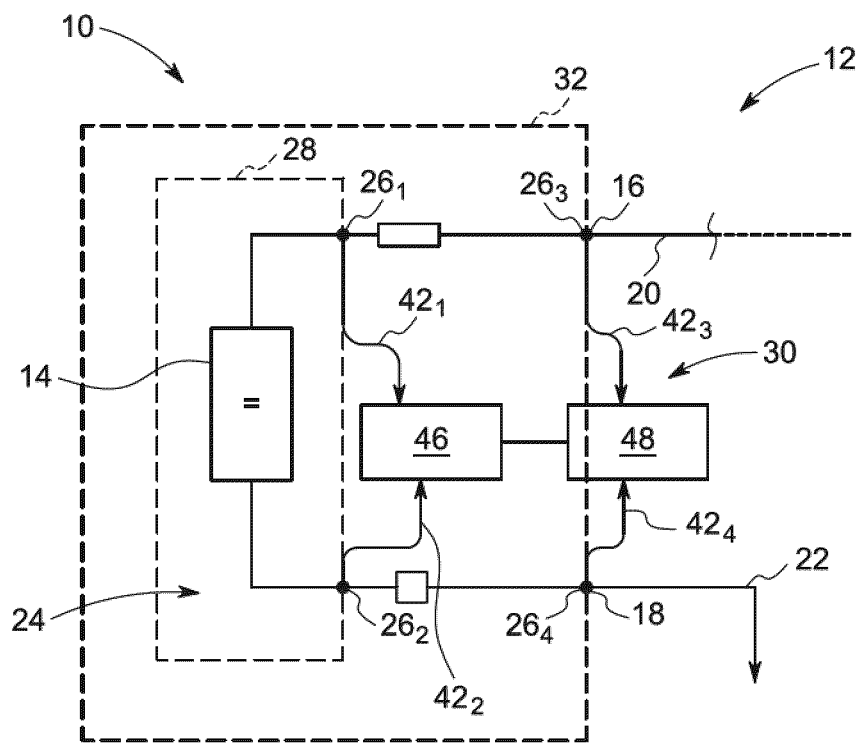
FIG. 1(a) shows a schematic view of a first protection circuit according to a first embodiment of the invention.

A protection circuit according to a first embodiment of the invention is designated generally by reference numeral 10, as shown in FIG. 1(a).

The first protection circuit 10 protects a part of a first HVDC power transmission network 12 that includes a first power converter 14, along with first and second DC terminals 16, 18 which, in use, connect the power converter 14 to first and second DC conduits 20, 22.

The first protection circuit 10 includes a first set 24 of first and second sensors $26_1$, $26_2$ which together define a first protection zone 28. The first protection zone 28 is arranged to protect the power converter 14, although this need not necessarily be the case.

The first protection circuit 10 also includes a second set 30 of sensors which includes third and fourth sensors $26_3$, $26_4$ that define a second protection zone 32, which is arranged to provide DC terminal protection.

Other embodiments of the invention (not shown) may include further sets of sensors, some of which sensors may be common to more than one set, with each set including at least two sensors to define a further, respective protection zone.

Meanwhile, in the embodiment shown each of the sensors $26_1$, $26_2$, $26_3$, $26_4$ is arranged to sense the current that flows through a current conductor, e.g. a busbar, with which it is connected. One type of such sensor is a fibre optic sensor, although other sensors types, such as a current transformer, may also be used.

The first protection circuit 10 additionally includes a controller 34 (a portion of which is shown schematically in FIG. 2) that is programmed to evaluate sensor information received from the sensors $26_1$, $26_2$, $26_3$, $26_4$ to determine whether a fault has occurred in one of the protection zones 28, 32 covering a part of the first power transmission network 12.

The controller 34 is also further programmed, in the event of a sensor in a protection zone failing, e.g. the first sensor $26_1$ in the first set 24 of sensors defining the first protection zone 28, to dynamically reconfigure the affected protection zone, i.e. the first protection zone 28, by including a sensor from another protection zone, i.e. by including one of the sensors $26_3$, $26_4$ in the second set 30 of sensors which define the second protection zone 32.

Figure 1B:
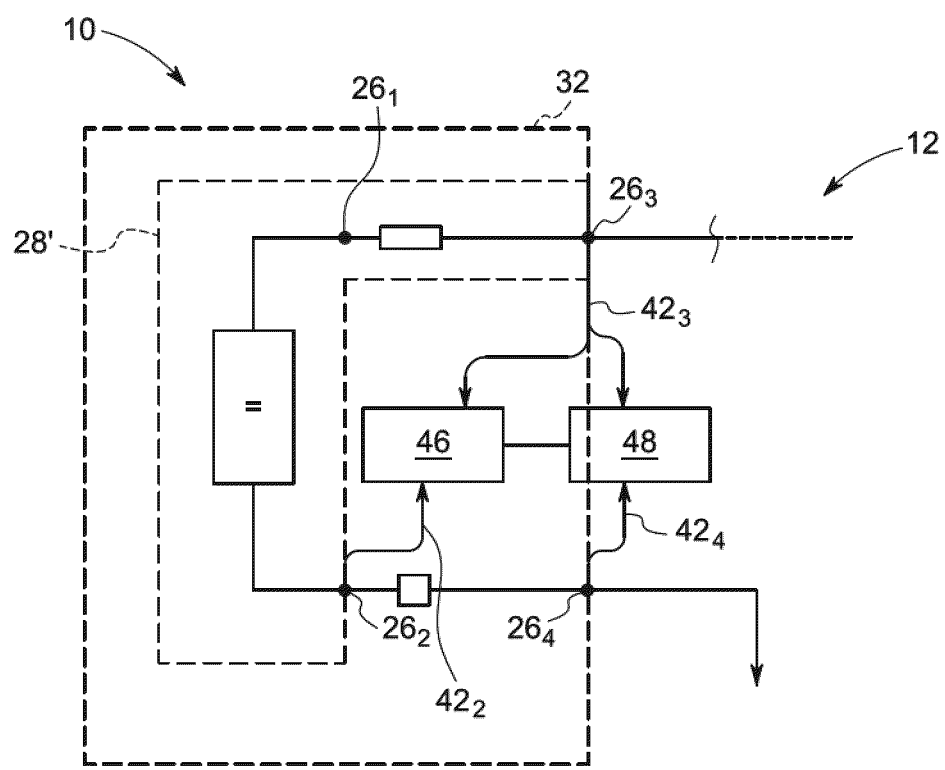
FIG. 1(b) shows the first protection circuit following the failure of a sensor therewithin.

One way in which the controller 34 may achieve such reconfiguring of the first protection zone 28 is illustrated schematically in FIG. 1(b). In the example way shown, the controller 34 reconfigures the first protection zone 28 by including the third sensor $26_3$ from the second set 30 of sensors such that the shape, i.e. configuration, of the first protection zone 28 changes to a modified first protection zone 28'.

More particularly, the controller 34 includes a switching module 36 that selects the sensor from another protection zone, e.g. the third sensor $26_3$ from the second protection zone 32. The switching module 36 makes such a selection based on the location of the failed sensor, e.g. the first sensor $26_1$ in the first protection zone 28.

In a preferred embodiment of the invention, the sensor to be selected from another protection zone is predetermined, depending on which other sensor fails, according to the design and configuration of the power transmission network which the associated protection circuit is arranged to protect.

Figure 2:
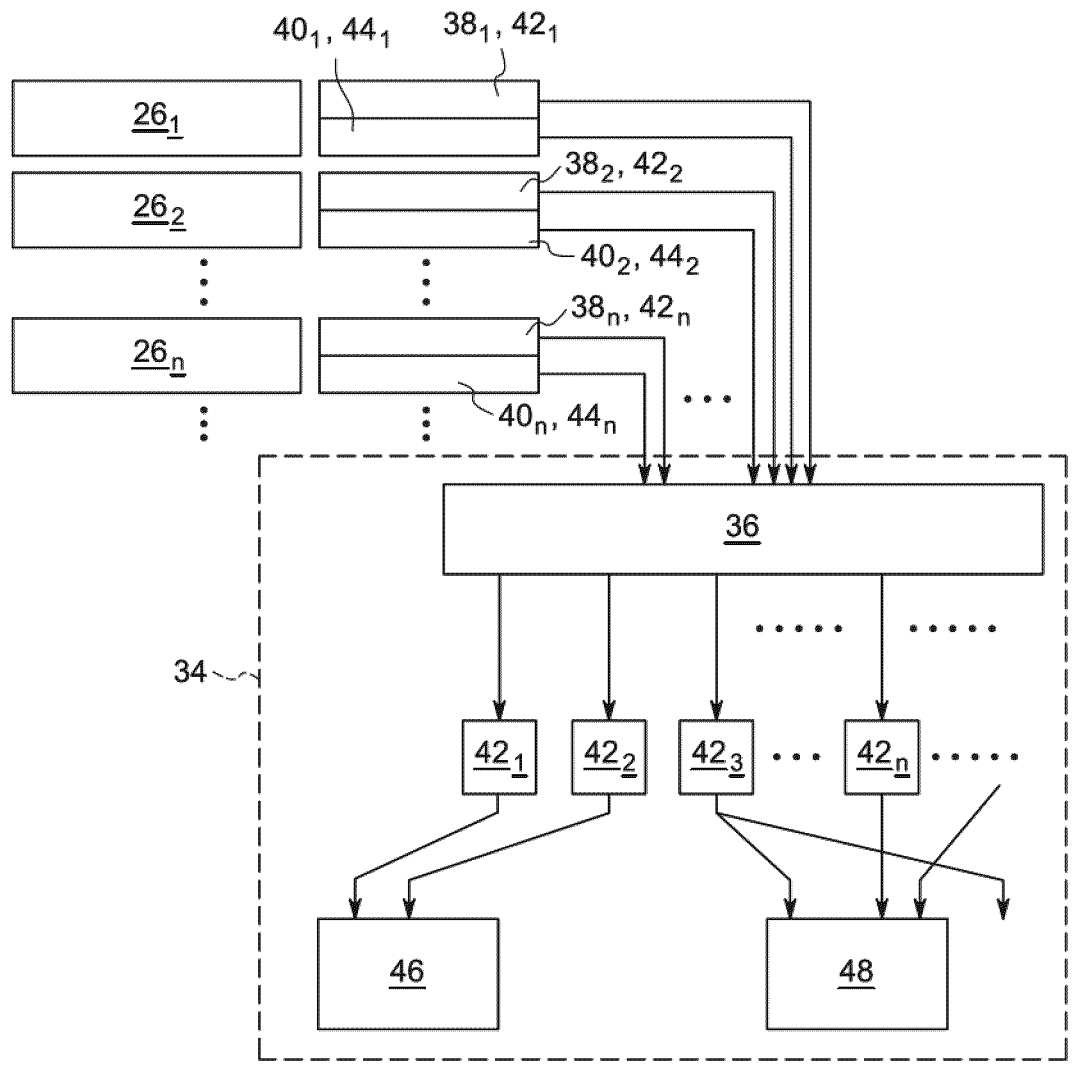
FIG. 2 shows a schematic view of a portion of a controller which forms a part of the first protection circuit.

The switching module 36 receives a first form of sensor information $38_1$, $38_2$ and a second form of sensor information $40_1$, $40_2$ from each sensor $26_1$, $26_2$, $26_3$, $26_4$, noting that FIG. 2 only illustrates the first and second sensors $26_1$, $26_2$, along with a schematic representation of input from further sensors $26_n$ and corresponding further first and second forms of sensor information $38_n$, $40_n$.

The first form of sensor information $38_1$, $38_2$, $38_n$ is current flow information $42_1$, $42_2$, $42_3$, $42_4$, $42_n$ and the second form of sensor information $40_1$, $40_2$, $40n$ is sensor status information $44_1$, $44_2$, $44_n$ i.e. an indication of whether or not the sensor $26_1$, $26_2$, $26_3$, $26_4$ is working correctly. An alarm can be triggered, e.g. on a control terminal within a network control station (not shown), in the event that one or more sensors $26_1$, $26_2$, $26_3$, $26_4$ is not working.

The switching module 36 utilises the sensor status information $44_1$, $44_2$, $44_n$ to identify a failed sensor, e.g. the first sensor $26_1$ in the first protection zone 28.

In addition, the switching module 36 inhibits further transmission within the controller 34 of the current flow information $42_1$, $42_2$, $42_n$ from the failed sensor, e.g. the first sensor $26_1$ from the first set 24 of sensors.

As well as the aforementioned switching module 36, the controller 34 of the first protection circuit 10 also includes first and second evaluation modules 46, 48, each of which is configured to evaluate current flow information $42_1$, $42_2$, $42_3$, $42_4$, $42_n$ to determine whether a fault has occurred within a given protection zone 28, 32.

Each of the first and second evaluation modules 46, 48 is a multiple evaluation module that is configured to evaluate whether a summation of the current flow information $42_1$, $42_2$, $42_3$, $42_4$, $42_n$ from a plurality of sensors $26_1$, $26_2$, $26_3$, $26_4$ exceeds a predetermined threshold.

More particularly, as shown schematically in FIG. 1(a), the first evaluation module 46 is initially configured to receive current flow information $42_1$, $42_2$, via the switching module 36, from the first set 24 of sensors $26_1$, $26_2$. The first evaluation module 46 evaluates this information and indicates that a fault, e.g. a phase to ground fault, has occurred in the first protection zone 28 in the event that a summation of the current flow information $42_1$, $42_2$ from the first set 24 of sensors $26_1$, $26_2$ exceeds the predetermined threshold. Thereafter, further circuit components (not shown) can be configured to react to the fault indication and interrupt the resulting fault current.

In a similar manner, as also shown schematically in FIG. 1(a), the second evaluation module 48 receives current flow information $42_3$, $42_4$, again via the switching module 36, from the second set 30 of sensors $26_3$, $26_4$. The second evaluation module 48 again similarly evaluates this information and indicates that a fault, e.g. a short circuit, has occurred in the second protection zone 32 in the event that a summation of the current flow information $42_3$, $42_4$ exceeds the predetermined threshold. Thereafter, further circuit components can again be configured to react to the fault indication and interrupt the resulting fault current.

In all instances, the current flow information $42_1$, $42_2$, $42_3$, $42_4$ transferred from the switching module 36 to each evaluation module 46, 48 is synchronised, i.e. the time at which the current flow information $42_1$, $42_2$, $42_3$, $42_4$ is distributed to the evaluation modules 46, 48 is coordinated to help avoid the triggering of a false protection event.

Accordingly, as shown in FIG. 2, such information, i.e. current flow information $42_1$, $42_2$, $42_3$, $42_4$ and synchronisation data, is exchanged within the controller 34 between the switching module 36 and the first and second evaluation modules 46, 48.

Meanwhile, in other embodiments of the invention (not shown), at least one evaluation module is a unitary evaluation module which is configured to evaluate whether the current flow information from a single sensor exceeds a predetermined threshold. Such a unitary evaluation module may again be configured to indicate that a fault, e.g. a phase to ground fault, has occurred in a corresponding protection zone in the event that the predetermined threshold is exceeded, such that thereafter, further circuit components could react to the fault indication and interrupt the resulting fault current.

Returning to the first protection circuit 10 shown in FIG. 1(a), following the failure of the first sensor $26_1$ and the dynamic reconfiguring of the first protection zone 28 into a modified first protection zone 28' (by including the third sensor $26_3$ from the second protection zone 32), the first evaluation module 46 is similarly dynamically reconfigured.

More particularly, the first evaluation module 46 is reconfigured, via the switching module 36, so that it continues to receive current flow information $42_2$ from the second sensor $26_2$, as well as current flow information $42_3$ additionally from the newly added third sensor $26_3$. The reconfigured first evaluation module 46 is then able to evaluate this information and continue to indicate that a fault, e.g. a phase to ground fault, has occurred in the now modified first protection zone 28', i.e. in the event that a summation of the current flow information $42_2$, $42_3$ from the second and third sensors $26_2$, $26_3$, exceeds the corresponding predetermined threshold. Consequently, further circuit components can continue to react to such a fault indication from within the modified first protection zone 28', and thereafter interrupt the resulting fault current.

Figure 3A:
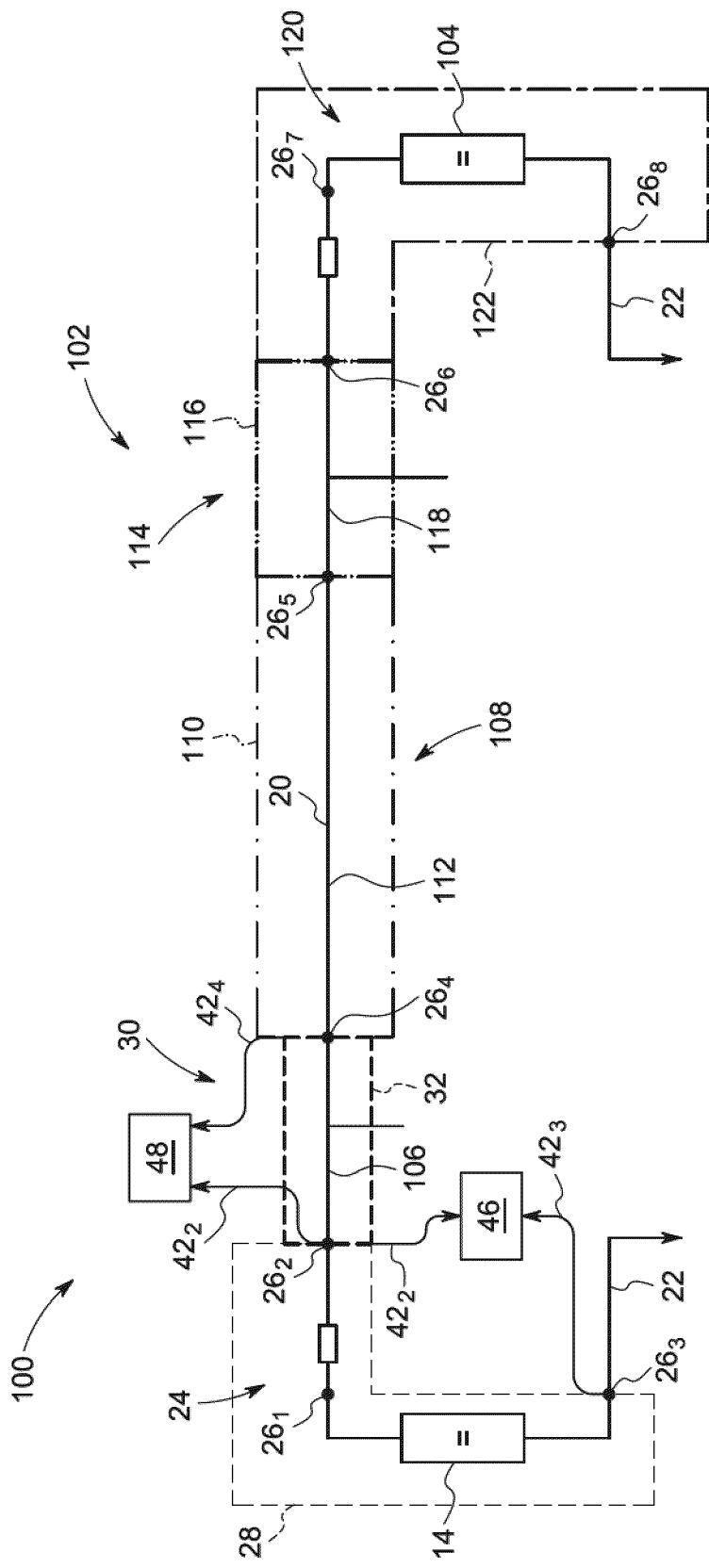
FIG. 3(a) shows a schematic view of a second protection circuit according to a second embodiment of the invention.

A protection circuit according to a second embodiment of the invention is designated generally by reference numeral 100, as shown in FIG. 3(a).

The second protection circuit 100 is similar to the first protection circuit 10 and like features share the same reference numerals. The second protection circuit 100 protects a whole of a second HVDC power transmission network 102 which, as well as including a first power converter 14 and first and second DC conduits 20, 22, also includes a second power converter 104.

The second protection circuit 100 includes a first set 24 of first, second and third sensors $26_1$, $26_2$, $26_3$ which together define a first protection zone 28, that is arranged to protect the first power converter 14.

The second protection circuit 100 also includes a second set 30 of second and fourth sensors $26_2$, $26_4$ that together define a second protection zone 32 which provides protection for a first converter-side portion 106 of the first DC conduit 20.

Meanwhile, a third set 108 of fourth and fifth sensors $26_4$, $26_5$ defines a third protection zone 110, which is arranged to protect a mid-portion 112 of the first DC conduit 20.

The second protection circuit 100 additionally includes a fourth set 114 of fifth and sixth sensors $26_5$, $26_6$ which together define a fourth protection zone 116, that is arranged to protect a second converter-side portion 118 of the first DC conduit 20.

The sixth sensor $26_6$ along with seventh and eighth sensors $26_7$, $26_8$ form a fifth set 120 of sensors that defines a fifth protection zone 122, which protects the second power converter 104.

Each of the aforementioned first to eight sensors $26_1$, $26_2$, $26_3$, $26_4$, $26_5$, $26_6$, $26_7$, $26_8$ is again a current sensor.

The second protection circuit 100 also includes a controller in the same form as shown schematically in FIG. 2, and which is similarly programmed to evaluate sensor information $43_2$, $42_3$, $42_4$ (only some of which information is illustrated in FIG. 3(a)) received from the sensors $26_1$, $26_2$, $26_3$, $26_4$, $26_5$, $26_6$, $26_7$, $26_8$, via respective corresponding evaluation modules 46, 48 (only two of which are shown in FIG. 3(a)), to determine whether a fault has occurred in one of the protection zones 28, 32, 110, 116, 122 in the second power transmission network 102.

As with the first protection circuit 10, the controller in the second protection circuit 100 is further programmed, in the event of a sensor in a protection zone failing, e.g. the second sensor $26_2$, to dynamically reconfigure the affected protection zone by including a sensor from another protection zone.

In this regard, the second sensor $26_2$ is common to both the first and second protection zones 28, 32, and so the controller, i.e. the switching module therewithin, reconfigures the affected first protection zone 28 by including the fourth sensor $26_4$ from the second and third protection zones 32, 110 to give a modified first protection zone 28'. The controller 32, i.e. the switching module 36, also dynamically reconfigures the affected second protection zone 32 by including the first sensor $26_1$ from the first protection zone 28 to give a modified second protection zone 32'.

The respective first and fourth sensors $26_1$, $26_4$ selected from other protection zones by the switching module 36 is again predetermined, in light of the location of the failed second sensor $26_2$, according to the design and configuration of the second power transmission network 102.

Meanwhile, each of the associated first and second evaluation modules 46, 48 is also reconfigured in a corresponding manner, via the switching module 36.

Figure 3B:
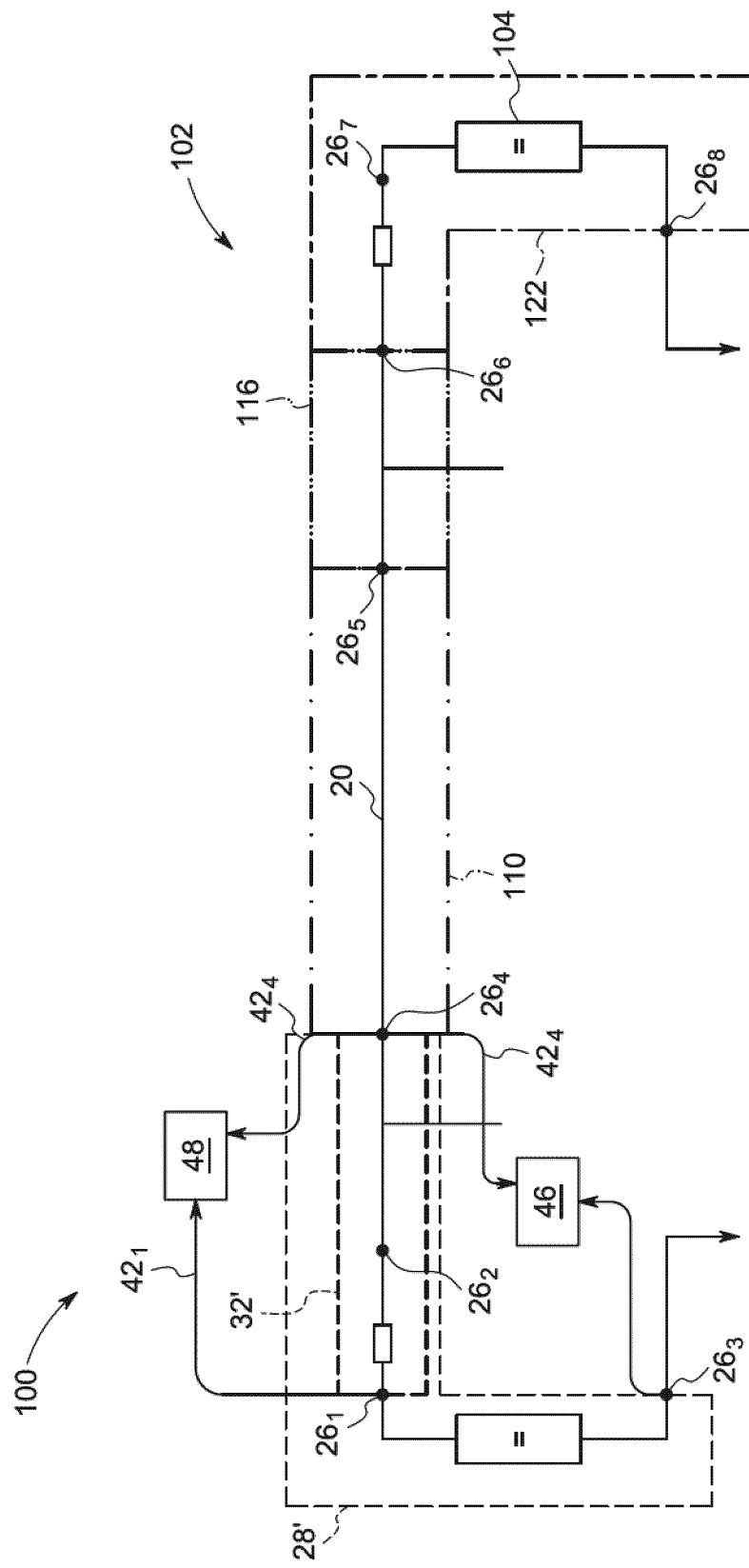
FIG. 3(b) shows the second protection circuit following the failure of a sensor therewithin.

More particularly, as shown schematically in FIG. 3(b), the first evaluation module 46 is reconfigured so that it continues to receive current flow information $42_3$ from the third sensor $26_3$ as well as current flow information $42_4$ additionally from the newly added fourth sensor $26_4$. Similarly, the second evaluation module 48 is reconfigured dynamically so that it continues to receive current flow information $42_4$ from the fourth sensor $26_4$, as well as also current flow information $42_1$ from the newly added first sensor $26_1$.

In the aforementioned manner, the reconfigured first evaluation module 46 is then able to evaluate the incoming current flow information $42_3$, $42_4$ and continue to indicate that a fault, e.g. a phase to ground fault, has occurred in the now modified first protection zone 28', i.e. in the event that a summation of the current flow information $42_3$, $42_4$ from the third and fourth sensors $26_3$, $26_4$ exceeds the corresponding predetermined threshold.

Similarly, the reconfigured second evaluation module 48 is subsequently able to evaluate the incoming current flow information $42_1$, $42_4$ and continue to indicate that a fault, e.g. a phase to ground fault, has occurred in the now modified second protection zone 32', i.e. in the event that a summation of the current flow information $42_1$, $42_4$ from the first and fourth sensors $26_1$, $26_4$ exceeds the corresponding predetermined threshold.

In each instance, further circuit components can again continue to react to such a fault indication from within either modified protection zone 28', 32' and thereafter interrupt the resulting fault current.

I claim:

1. A protection circuit, for protecting a whole or part of a high voltage direct current (HVDC) power transmission network, comprising:
    a plurality of sets of sensors, each of which set defines a respective protection zone, wherein a first protection zone of the protection circuit comprises a first sensor of the set of sensors, wherein a second protection zone of the protection circuit comprises a second sensor of the set of sensors; and
    a controller comprising a first evaluation module programmed to evaluate first sensor information received from the first sensor to determine whether a fault has occurred within the first protection zone and further comprising a second evaluation module programmed to evaluate second sensor information received from the second sensor to determine whether a fault has occurred within the second protection zone,
    the controller being further programmed, in the event of the first sensor failing, to dynamically reconfigure the first protection zone by adding the second sensor information from the second sensor to the first evaluation module's evaluation of the first protection zone.

2. A protection circuit according to claim 1, wherein the controller includes a switching module to select the second sensor to be added to the first protection zone based on the dynamic reconfiguration.

3. A protection circuit according to claim 2, wherein the switching module receives first and second forms of sensor information from each sensor, the first form of sensor information being current flow information and the second form of sensor information being sensor status information.

4. A protection circuit according to claim 3, wherein the switching module utilises the sensor status information to identify a failed sensor and thereafter select the second sensor to reconfigure the first protection zone.

5. A protection circuit according to claim 4, wherein following the identification of the first sensor failing, the switching module inhibits further transmission within the first evaluation module of the current flow information from the first sensor.

6. A protection circuit according to claim 3, wherein at least one of the first evaluation module or the second evaluation module is a unitary evaluation module configured to evaluate whether the current flow information from a single sensor exceeds a predetermined threshold.

7. A protection circuit according to claim 3, wherein at least one of the first evaluation module or the second evaluation module is a multiple evaluation module configured to evaluate whether a summation of the current flow information from a plurality of sensors exceeds a predetermined threshold.

8. A protection circuit according to claim 3, wherein the transfer of current flow information from the switching module to each evaluation module is synchronised.

9. A method of operating a protection circuit for a whole or part of a HVDC power transmission network, the protection circuit including a plurality of sets of sensors each of which set defines a respective protection zone, wherein a first protection zone of the protection circuit comprises a first sensor of the set of sensors, wherein a second protection zone of the protection circuit comprises a second sensor of the set of sensors, and a controller comprising a first evaluation module which receives first sensor information from the first sensor, and further comprising a second evaluation module which receives second sensor information from the second sensor, and
    the method comprising the steps of:
    (a) evaluating, using the first evaluation module, the first sensor information to determine whether a fault has occurred within the first protection zone; and
    (b) in the event of the first sensor in the first protection zone failing, dynamically reconfiguring the first protection zone by adding the second sensor information from the second sensor to the first evaluation module's evaluation of the first protection zone.

* * * * *